(12) United States Patent
Takagi

(10) Patent No.: US 9,590,562 B2
(45) Date of Patent: Mar. 7, 2017

(54) SEMICONDUCTOR AMPLIFIER BIAS CIRCUIT AND SEMICONDUCTOR AMPLIFIER DEVICE

(71) Applicant: Kabushiki Kaisha Toshiba, Minato-ku (JP)

(72) Inventor: Kazutaka Takagi, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/817,583

(22) Filed: Aug. 4, 2015

(65) Prior Publication Data

US 2016/0126897 A1 May 5, 2016

(30) Foreign Application Priority Data

Oct. 31, 2014 (JP) ................................. 2014-222927

(51) Int. Cl.
*H03F 3/191* (2006.01)
*H03F 1/02* (2006.01)
(Continued)

(52) U.S. Cl.
CPC .............. *H03F 1/0205* (2013.01); *H03F 1/56* (2013.01); *H03F 1/565* (2013.01); *H03F 3/193* (2013.01);
(Continued)

(58) Field of Classification Search
CPC ....................................................... H03F 3/191
(Continued)

(56) References Cited

U.S. PATENT DOCUMENTS 6,066,997 A * 5/2000 Matsugatani ........ H03B 5/1852
327/119
6,724,263 B2 * 4/2004 Sugiura .................. H03F 3/191
330/302
(Continued)

FOREIGN PATENT DOCUMENTS

EP    2 262 107 B1    9/2012
JP    7-38350 A       2/1995
(Continued)

OTHER PUBLICATIONS

Extended European Search Report issued on Mar. 21, 2016 in European Patent Application No. 15175539-4.
(Continued)

*Primary Examiner* — Henry Choe
(74) *Attorney, Agent, or Firm* — Oblon, McClelland, Maier & Neustadt, L.L.P.

(57) ABSTRACT

A semiconductor amplifier bias circuit includes a first transmission line, a first grounded capacitor, a second transmission line and a power supply terminal. The first transmission line is connected to an output end part of the output matching circuit and the external load. The second transmission line includes one end part connected to the first transmission line and the other end part connected to the first grounded shunt capacitor. An electrical length of the second transmission line is approximately 90° at a center frequency of a band. The one end part is connected to the first transmission line at a position apart from the output end part by an electrical length of approximately 45° at the center frequency. The power supply terminal is connected to a connection point of the first grounded shunt capacitor and the other end part of the second transmission line.

14 Claims, 14 Drawing Sheets

(51) Int. Cl.
*H03F 1/56* (2006.01)
*H03F 3/193* (2006.01)

(52) U.S. Cl.
CPC .. *H03F 2200/222* (2013.01); *H03F 2200/387* (2013.01); *H03F 2200/555* (2013.01)

(58) Field of Classification Search
USPC .................................................. 330/302, 305
See application file for complete search history.

(56) References Cited

U.S. PATENT DOCUMENTS

| | | | |
|---|---|---|---|
| 7,176,769 B1 | 2/2007 | Ellis | |
| 7,245,186 B2* | 7/2007 | Chang | H03F 3/191 327/552 |
| 7,345,539 B2* | 3/2008 | Tayrani | H03F 3/2176 330/207 A |
| 7,443,236 B2* | 10/2008 | Dow | H03F 1/14 330/129 |
| 7,508,269 B2* | 3/2009 | Fukuda | H03F 1/086 330/302 |
| 8,604,883 B2 | 12/2013 | Takagi et al. | |
| 8,643,438 B2 | 2/2014 | Takagi et al. | |
| 8,653,896 B2 | 2/2014 | Takagi et al. | |
| 9,035,702 B2 | 5/2015 | Takagi | |
| 2004/0041634 A1 | 3/2004 | Sugiura | |
| 2005/0083134 A1 | 4/2005 | Kapoor et al. | |
| 2007/0296505 A1* | 12/2007 | Oka | H03F 1/56 330/302 |
| 2009/0167438 A1 | 7/2009 | Yang et al. | |
| 2010/0079211 A1 | 4/2010 | Matsuda et al. | |
| 2013/0194042 A1* | 8/2013 | Sanduleanu | H03F 1/223 330/302 |
| 2013/0234794 A1 | 9/2013 | Takagi | |
| 2016/0072450 A1 | 3/2016 | Takagi | |
| 2016/0218676 A1 | 7/2016 | Takagi et al. | |
| 2016/0218677 A1 | 7/2016 | Takagi | |
| 2016/0218678 A1 | 7/2016 | Takagi | |

FOREIGN PATENT DOCUMENTS

| | | |
|---|---|---|
| JP | 9-172335 A | 6/1997 |
| JP | 3006252 B2 | 11/1999 |
| JP | 2001-217659 A | 8/2001 |
| JP | 2009-253785 A | 10/2009 |
| JP | 2011-35761 A | 2/2011 |
| JP | 2012-52195 | 3/2012 |
| JP | 4936965 | 5/2012 |
| JP | 2013-187773 | 9/2013 |
| JP | 2013-187775 A | 9/2013 |
| JP | 5468095 | 4/2014 |
| JP | 2014-207332 | 10/2014 |
| JP | 2014-207333 | 10/2014 |
| JP | 2014-207576 | 10/2014 |
| JP | 5642048 | 12/2014 |
| JP | 2015-149626 A | 8/2015 |
| JP | 2015-149627 A | 8/2015 |
| JP | 2016-58821 A | 4/2016 |
| JP | 2016-139922 A | 8/2016 |
| JP | 2016-139923 A | 8/2016 |
| JP | 2016-139951 A | 8/2016 |

OTHER PUBLICATIONS

Office Action issued on Mar. 17, 2016 in Korean Patent Application No. 10-2015-0088877.
Office Action issued Apr. 15, 2016 in Taiwanese Patent Application No. 104116681.
Andrei Grebennikov, "High-Efficiency Class E/F Lumped and Transmission-Line Power Amplifiers", IEEE Transactions on Microwave Theory and Techniques, vol. 59, No. 6, Jun. 2011, pp. 1579-1588.
U.S. Appl. No. 14/801,227, filed Jul. 16, 2015, Kazutaka Takagi.
Raymond Bassett "High-Power GaAs FET Device Bias Considerations", Fujitsu Application 10, 2008, 7 pages.
Japanese Office Action issued Jul. 29, 2016 in Patent Application No. 2014-222927 (with English Translation).
Office Action issued Aug. 24, 2016 in Canadian Patent Application No. 2,900,000.
Office Action issued Sep. 28, 2016 in Korean Patent Application No. 10-2015-0088877.

* cited by examiner

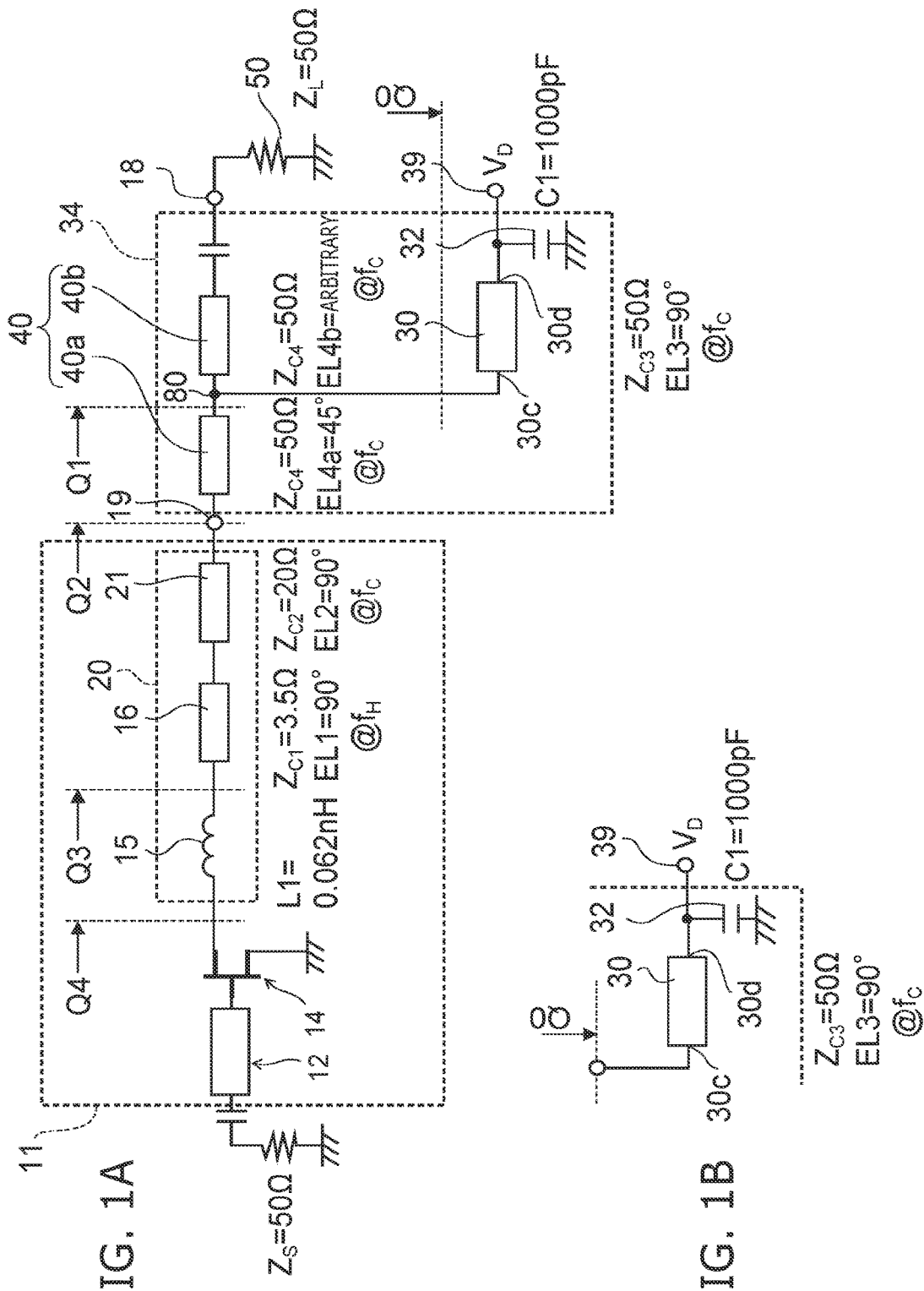

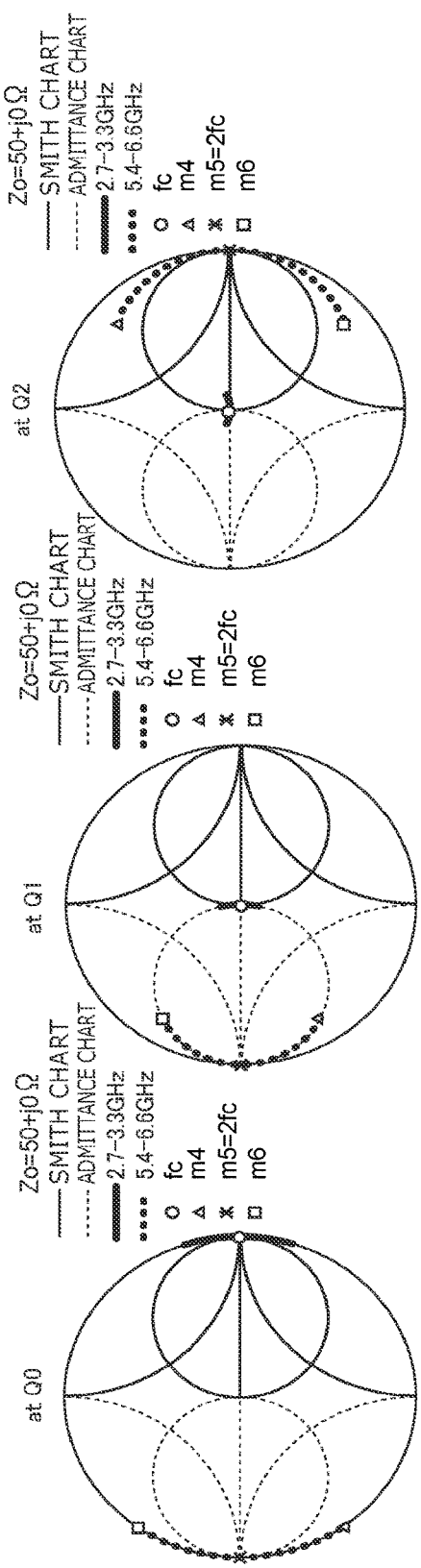
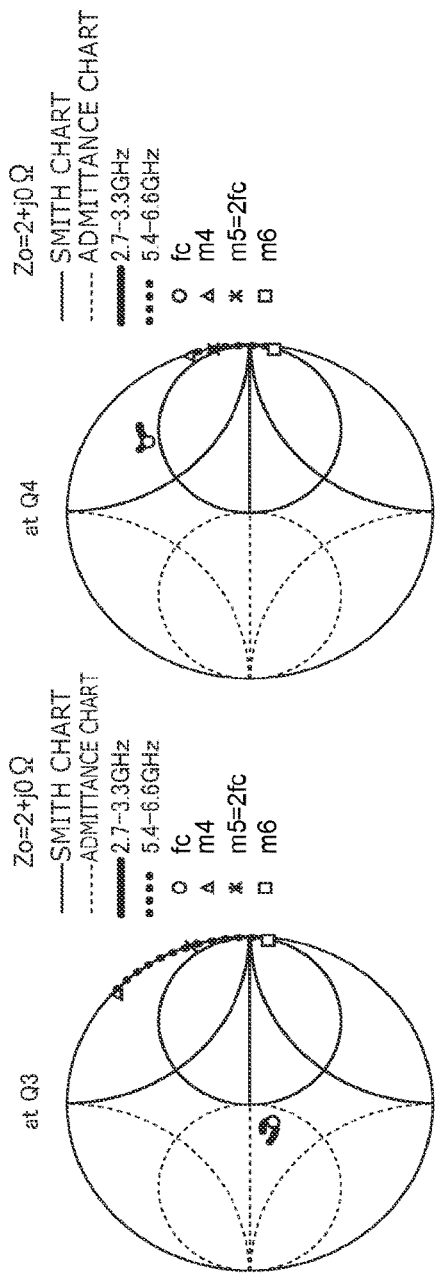
FIG. 2A
FIG. 2B
FIG. 2C
FIG. 2D
FIG. 2E

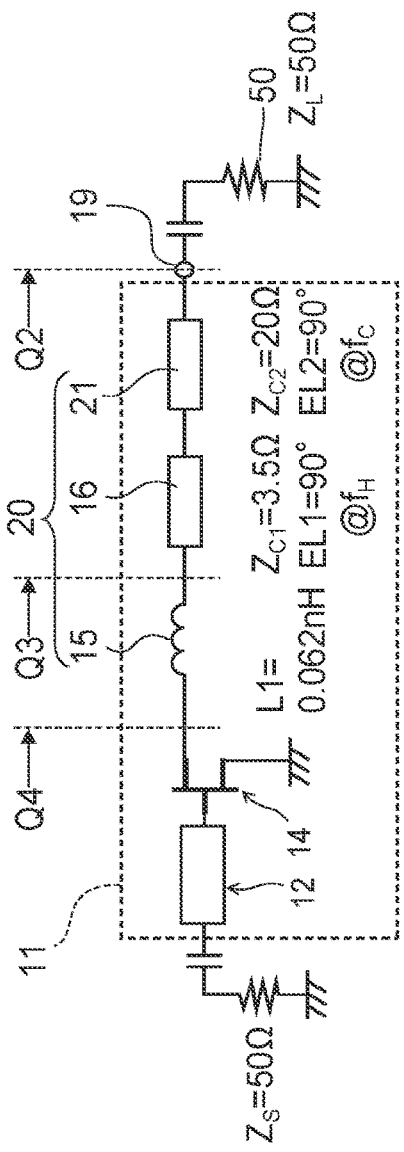
FIG. 3A
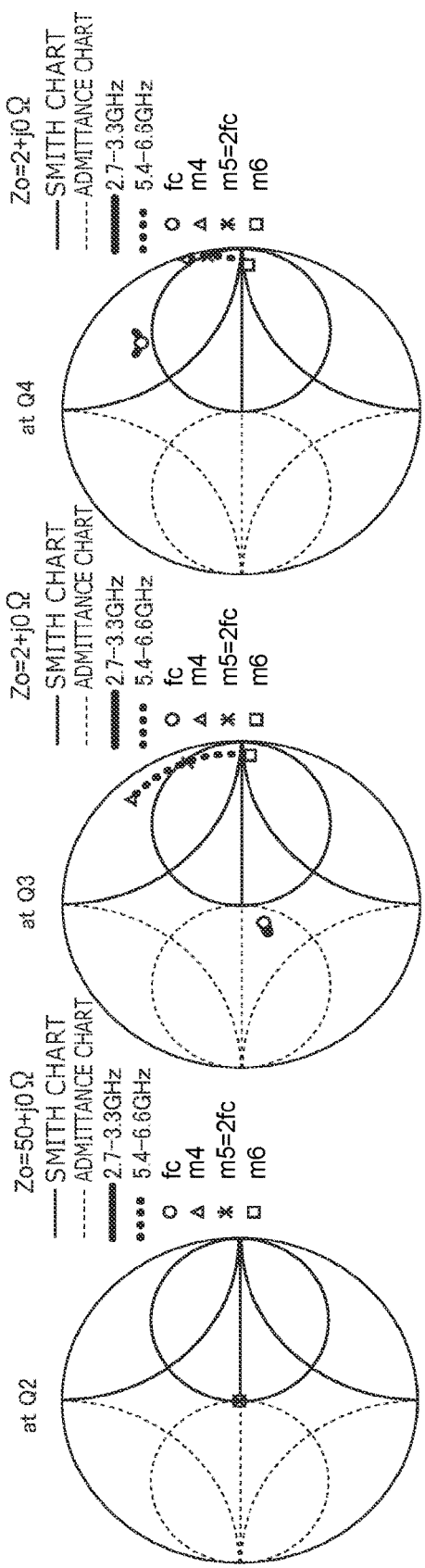
FIG. 3B
FIG. 3C
FIG. 3D

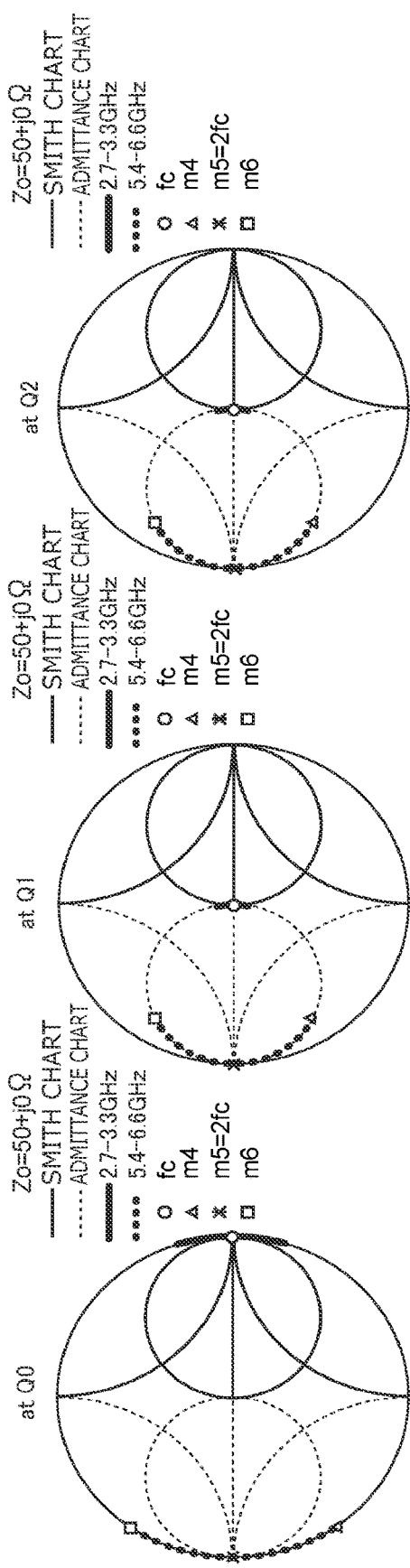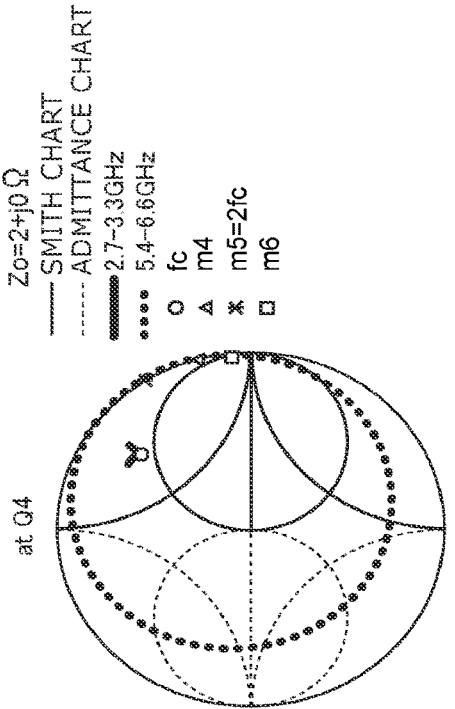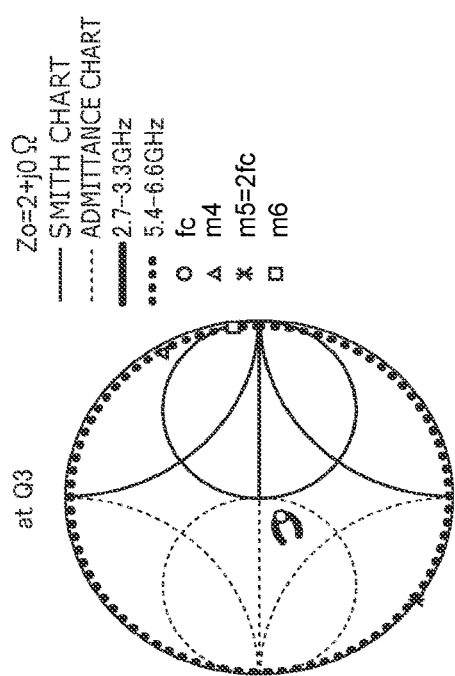
FIG. 5A  FIG. 5B  FIG. 5C  FIG. 5D  FIG. 5E

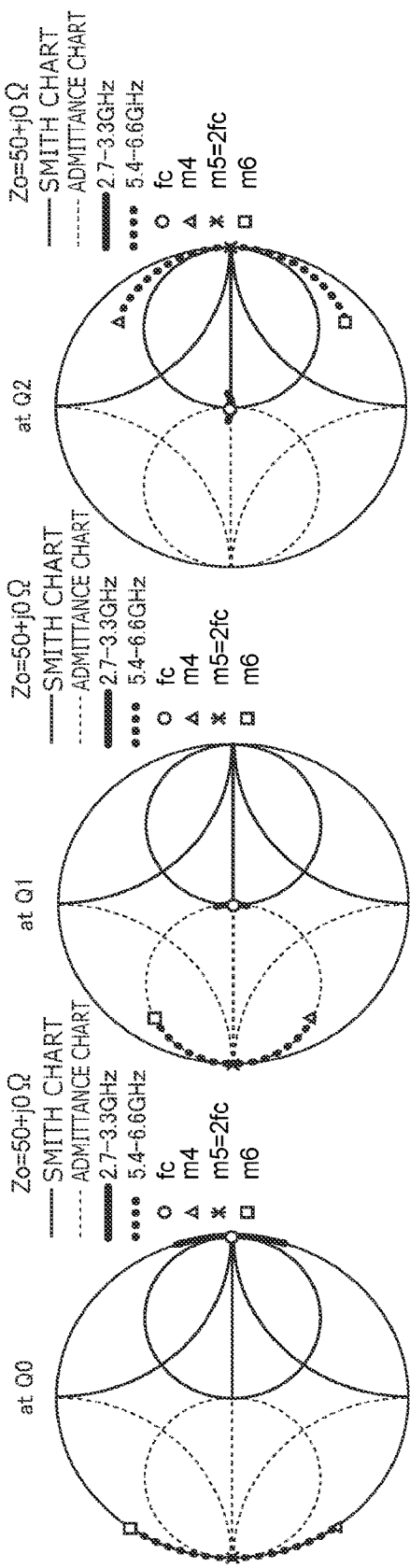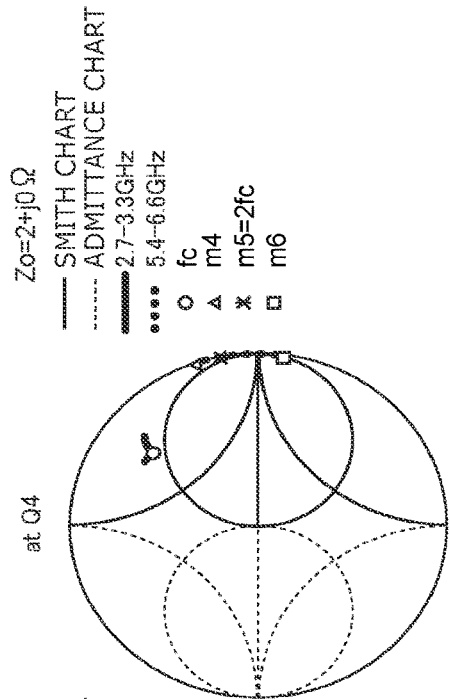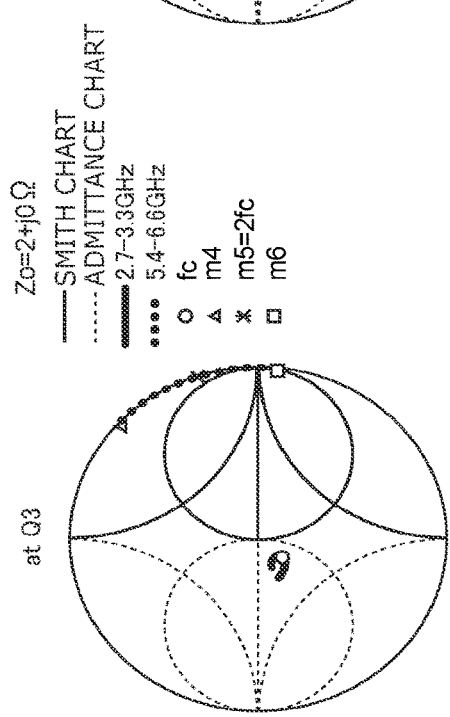
FIG. 7A  FIG. 7B  FIG. 7C  FIG. 7D  FIG. 7E

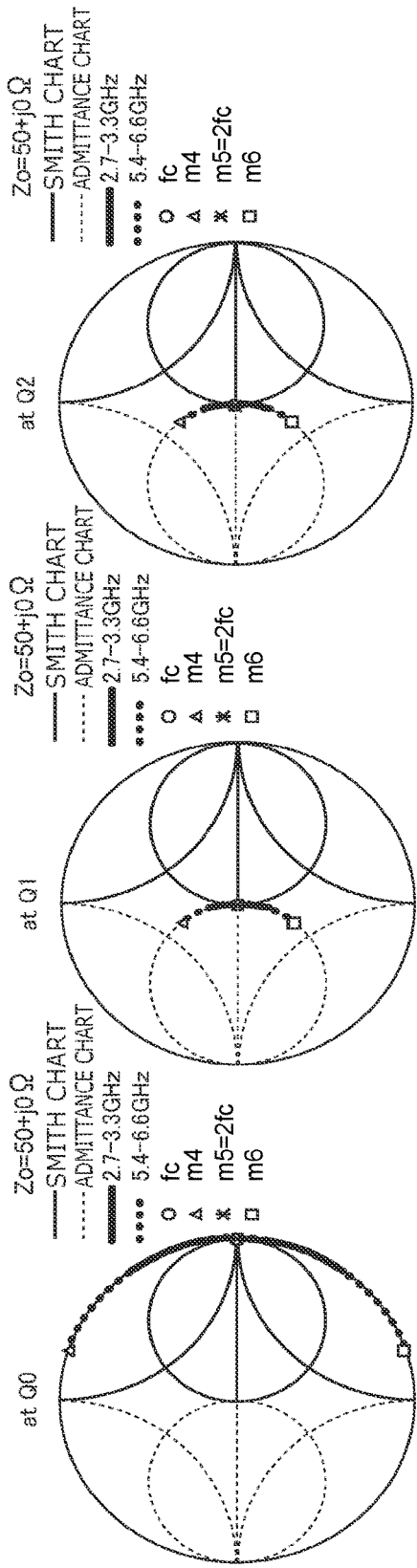
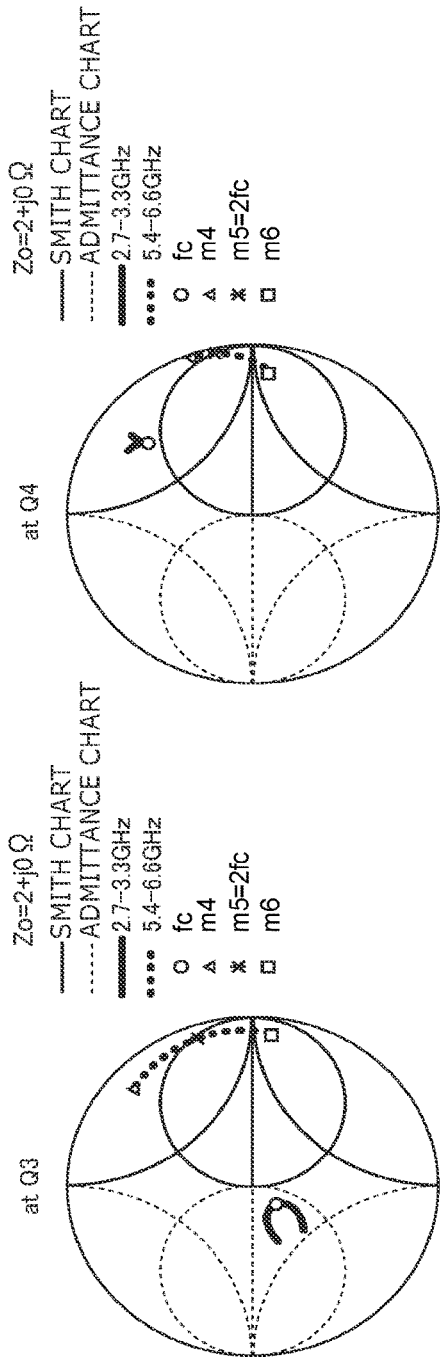
FIG. 9A
FIG. 9B
FIG. 9C
FIG. 9D
FIG. 9E

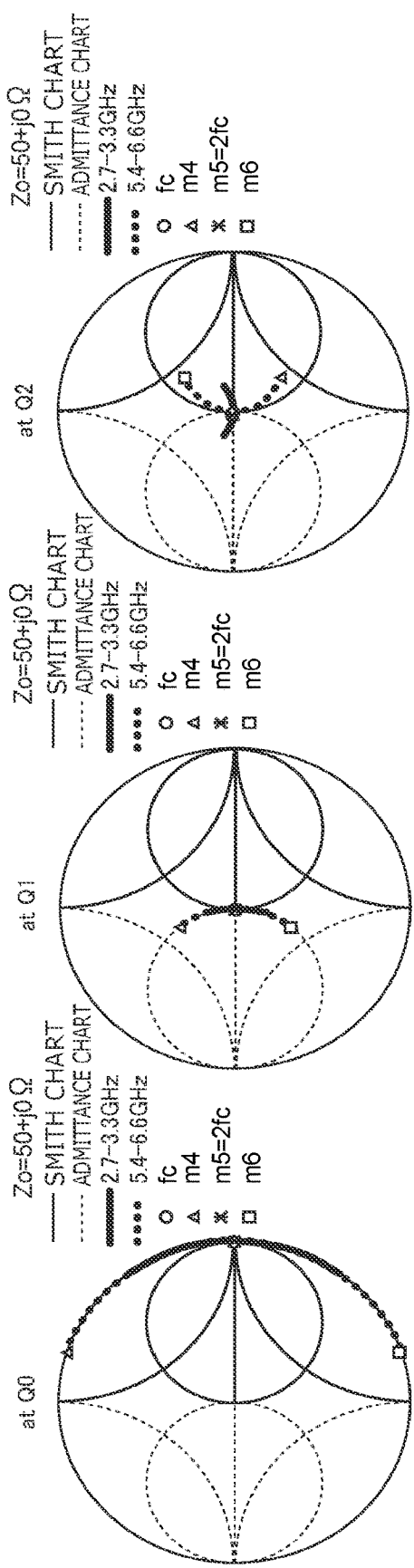
FIG. 10A
FIG. 10B
FIG. 10C
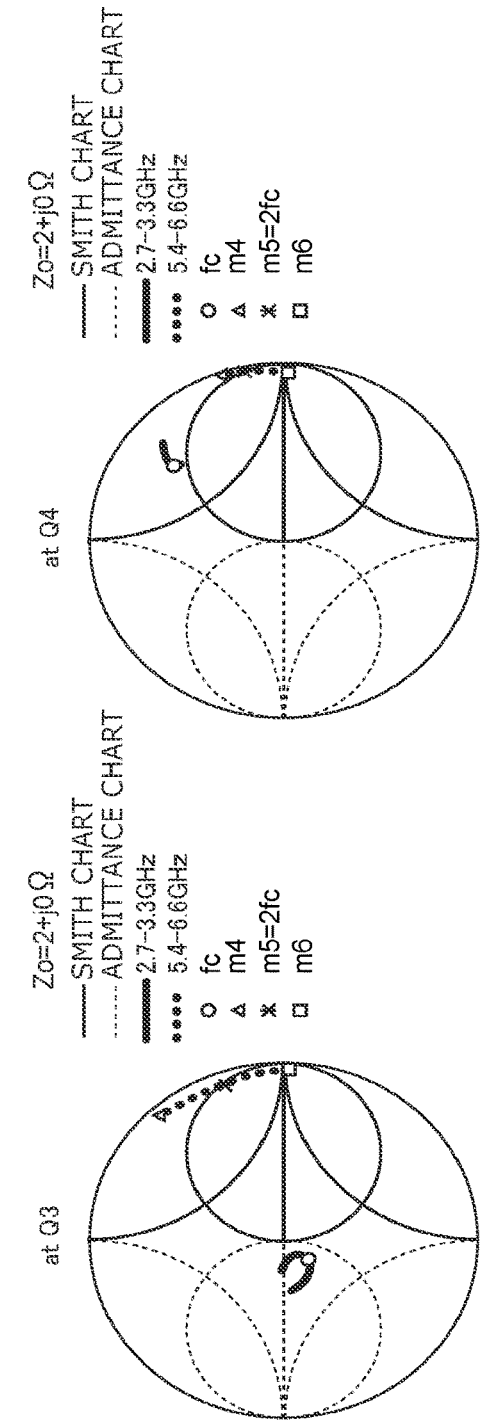
FIG. 10D
FIG. 10E

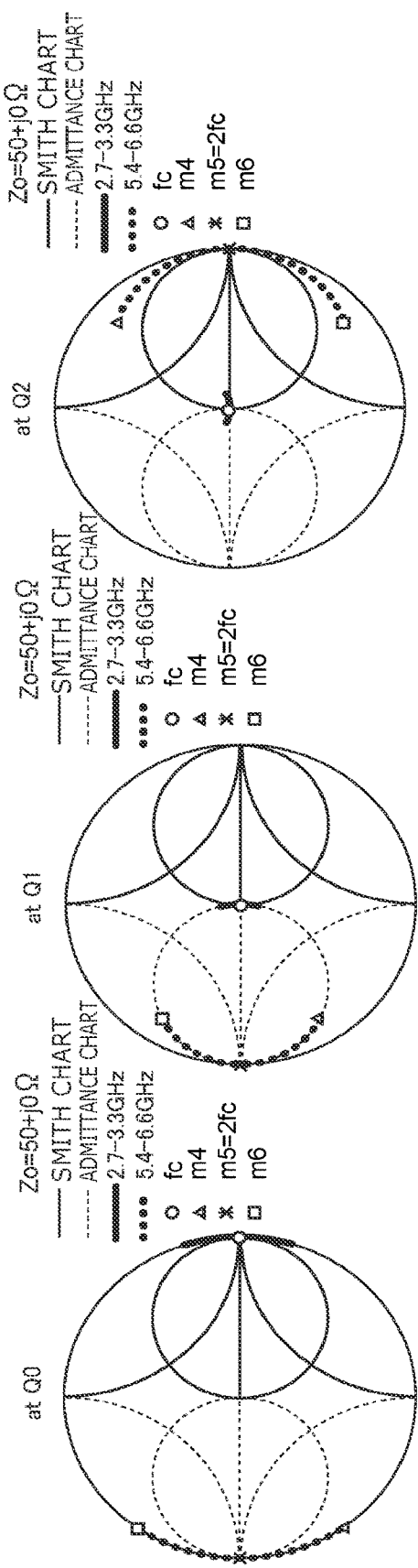
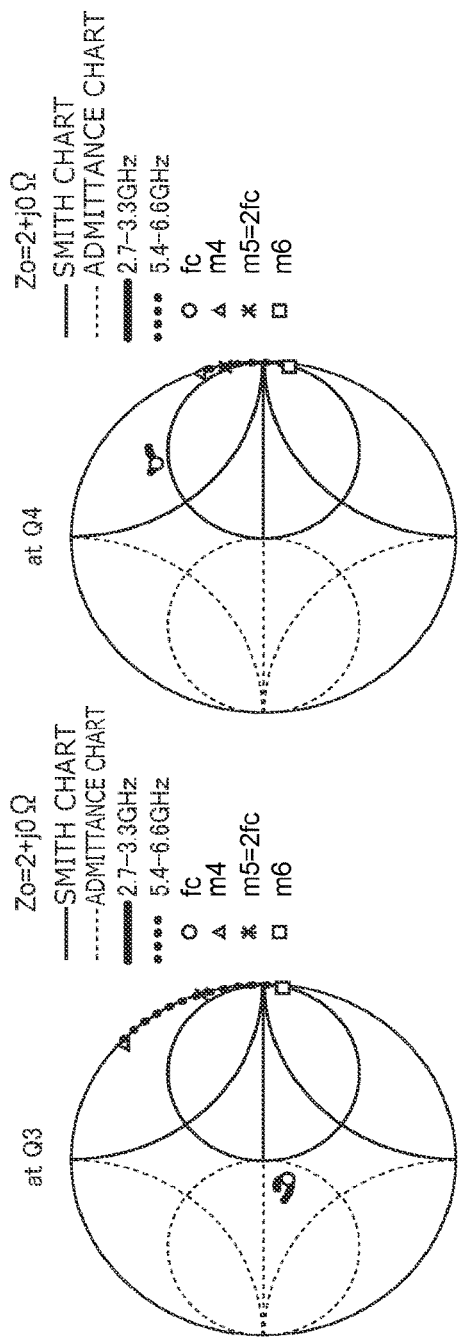
FIG. 12A  FIG. 12B  FIG. 12C  FIG. 12D  FIG. 12E

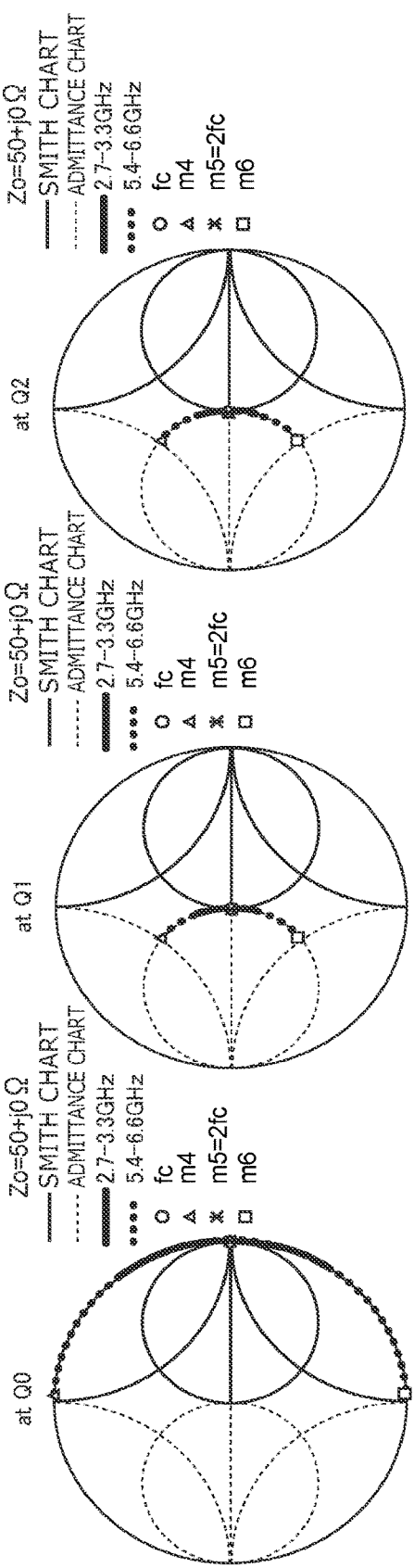
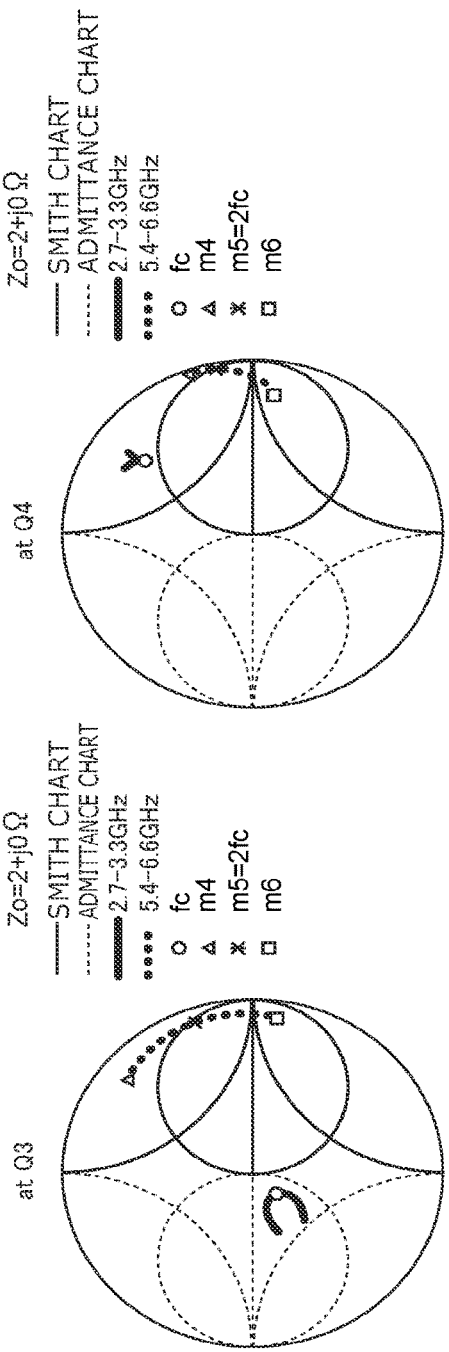
FIG. 14A
FIG. 14B
FIG. 14C
FIG. 14D
FIG. 14E

SEMICONDUCTOR AMPLIFIER BIAS CIRCUIT AND SEMICONDUCTOR AMPLIFIER DEVICE

CROSS-REFERENCE TO RELATED APPLICATIONS

This application is based upon and claims the benefit of priority from Japanese Patent Application No. 2014-222927, filed on Oct. 31, 2014; the entire contents of which are incorporated herein by reference.

FIELD

Embodiments described herein relate generally a semiconductor amplifier bias circuit and a semiconductor amplifier device.

BACKGROUND

In a microwave semiconductor amplifying element, high efficiency operation can be achieved when the load impedance for the second harmonic seen from the output electrode end of the semiconductor amplifying element is made near-open.

In this case, it is assumed that the load impedance for the second harmonic signal seen from the output end part of the package is e.g. approximately 50Ω or more. Here, the term "approximately 50Ω" means 47Ω or more and 53Ω or less.

However, when a bias circuit is provided between the output matching circuit and the external load, the load impedance for almost part of the second harmonic signal seen from the output end part of the package may fall below 50Ω. This may decrease the efficiency.

BRIEF DESCRIPTION OF THE DRAWINGS

FIG. 1A is a circuit diagram of a semiconductor amplifier device according to a first embodiment, and FIG. 1B is a circuit diagram of a feed branch section of an external bias circuit;

FIG. 2A is a Smith chart showing the load impedance seen from the reference plane Q0 in the feed branch section of the semiconductor amplifier device of the first embodiment, FIG. 2B is a Smith chart showing the load impedance seen from the reference plane Q, FIG. 2C is a Smith chart showing the load impedance seen from the reference plane Q2, FIG. 2D is a Smith chart showing the load impedance seen from the reference plane Q3, and FIG. 2E is a Smith chart showing the load impedance seen from the reference plane Q4;

FIG. 3A is a circuit diagram of the semiconductor amplifier of the first embodiment in which no output bias circuit is connected, FIG. 3B is a Smith chart showing the load impedance seen from the reference plane Q2 in the semiconductor amplifier device of the first embodiment, FIG. 3C is a Smith chart showing the load impedance seen from the reference plane Q3, and FIG. 3D is a Smith chart showing the load impedance seen from the reference plane Q4;

FIG. 5A is a Smith chart showing the load impedance seen from the reference plane Q0 in the feed branch section of the semiconductor amplifier device of the comparative example, FIG. 5B is a Smith chart showing the load impedance seen from the reference plane Q1, FIG. 5C is a Smith chart showing the load impedance seen from the reference plane Q2, FIG. 5D is a Smith chart showing the load impedance seen from the reference plane Q3, and FIG. 5E is a Smith chart showing the load impedance seen from the reference plane Q4;

FIG. 7A is a Smith chart showing the load impedance seen from the reference plane Q0 in the feed branch section of the semiconductor amplifier device of the second embodiment, FIG. 7B is a Smith chart showing the load impedance seen from the reference plane Q1, FIG. 7C is a Smith chart showing the load impedance seen from the reference plane Q2, FIG. 7D is a Smith chart showing the load impedance seen from the reference plane Q3, and FIG. 7E is a Smith chart showing the load impedance seen from the reference plane Q4;

FIG. 9A is a Smith chart showing the load impedance seen from the reference plane Q0 in the feed branch section of the semiconductor amplifier device of the third embodiment, FIG. 9B is a Smith chart showing the load impedance seen from the reference plane Q1, FIG. 9C is a Smith chart showing the load impedance seen from the reference plane Q2, FIG. 9D is a Smith chart showing the load impedance seen from the reference plane Q3, and FIG. 9E is a Smith chart showing the load impedance seen from the reference plane Q4;

FIG. 10A is a Smith chart showing the load impedance seen from the reference plane Q0 in the feed branch section of the semiconductor amplifier device (X=45°) of the third embodiment, FIG. 10B is a Smith chart showing the load impedance seen from the reference plane Q1, FIG. 10C is a Smith chart showing the load impedance seen from the reference plane Q2, FIG. 10D is a Smith chart showing the load impedance seen from the reference plane Q3, and FIG. 10E is a Smith chart showing the load impedance seen from the reference plane Q4;

FIG. 12A is a Smith chart showing the load impedance seen from the reference plane Q0 in the feed branch section of the semiconductor amplifier device of the fourth embodiment, FIG. 12B is a Smith chart showing the load impedance seen from the reference plane Q1, FIG. 12C is a Smith chart showing the load impedance seen from the reference plane Q2, FIG. 12D is a Smith chart showing the load impedance seen from the reference plane Q3, and FIG. 12E is a Smith chart showing the load impedance seen from the reference plane Q4;

FIG. 14A is a Smith chart showing the load impedance seen from the reference plane Q0 in the feed branch section of the semiconductor amplifier device of the fifth embodiment, FIG. 14B is a Smith chart showing the load impedance seen from the reference plane Q1, FIG. 14C is a Smith chart showing the load impedance seen from the reference plane Q2, FIG. 14D is a Smith chart showing the load impedance seen from the reference plane Q3, and FIG. 14E is a Smith chart showing the load impedance seen from the reference plane Q4.

DETAILED DESCRIPTION

Figures 4A, 4B:
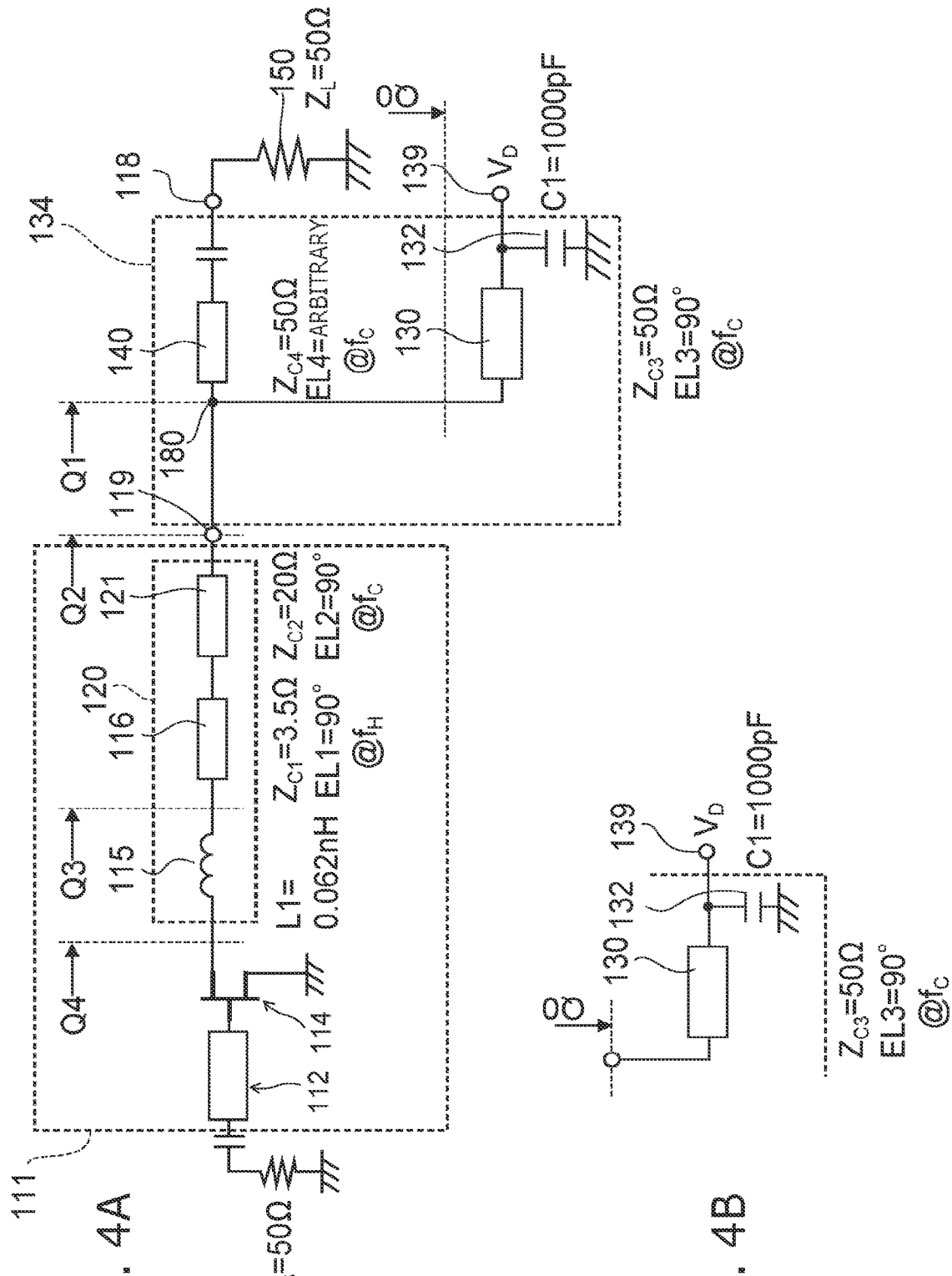
FIG. 4A is a configuration diagram of a semiconductor amplifier device according to a comparative example.
FIG. 4B is a circuit diagram of a feed branch section of an external bias circuit.

In general, according to one embodiment, a semiconductor amplifier bias circuit includes a first transmission line, a first grounded capacitor, a second transmission line and a power supply terminal. The first transmission line is connected to an output end part of the output matching circuit and the external load. The second transmission line includes one end part connected to the first transmission line and the other end part connected to the first grounded shunt capacitor. An electrical length of the second transmission line is approximately 90° at a center frequency of a band. The one end part is connected to the first transmission line at a position apart from the output end part by an electrical length of approximately 45° at the center frequency. The power supply terminal is connected to a connection point of the first grounded shunt capacitor and the other end part of the second transmission line.

Embodiments of the invention will now be described with reference to the drawings.

FIG. 1A is a circuit diagram of a semiconductor amplifier device according to a first embodiment. FIG. 1B is a circuit diagram of a feed branch section of an external bias circuit.

The semiconductor amplifier device includes a packaged semiconductor amplifier 11 and a (semiconductor amplifier) bias circuit 34.

The packaged semiconductor amplifier 11 includes a semiconductor amplifying element 14, an input matching circuit 12, and an output matching circuit 20. The bias circuit 34 shown in FIGS. 1A and 1B is connected between the output end part 19 of the package and an external load 50.

The bias circuit 34 is connected between the packaged semiconductor amplifier 11 and the external load 50. In this case, the characteristic impedance $Z_{C4}$ of the first transmission line 40 of the bias circuit 34 is made equal to the resistance $Z_L$ of the external load 50. Then, impedance matching between the first transmission line 40 and the external load 50 is easily achieved. Thus, the load impedance for the fundamental signal seen from the reference plane Q2 (i.e., output end part 19) is equal to the resistance $Z_L$. The resistance $Z_L$ can be set to e.g. 50Ω.

The semiconductor amplifying element 14 includes e.g. a HEMT (high electron mobility transistor) or GaAs MESFET (metal semiconductor field effect transistor). The semiconductor amplifying element 14 has an amplification function in the microwave band.

The output matching circuit 20 includes a bonding wire and a transmission line 16. The bonding wire 15 is connected to the semiconductor amplifying element 14. The transmission line 16 is connected to the bonding wire 15. The electrical length EL1 of the transmission line 16 is 90° or less at the upper limit frequency $f_H$ of the band. As shown in FIGS. 1A and 1B, the output matching circuit 20 may further include a transmission line 21. The transmission line 21 is cascaded to the transmission line 16. The electrical length EL2 of the transmission line 21 is 90° or less at the center frequency $f_C$ of the band.

The bias circuit 34 includes a first transmission line 40, a first grounded shunt capacitor 32, a second transmission line 30, and a power supply terminal 39. The first transmission line 40 is a main signal line. The second transmission line 30 is branched from the first transmission line 40. The first transmission line 40 includes one end part connected to the output end part 19 of the output matching circuit 20, and the other end part (being an output terminal of the amplifier device) connected to the external load 50.

The electrical length EL3 of the second transmission line 30 is approximately 90° at the center frequency $f_C$ of the band. One end part of the second transmission line 30 is connected to the first transmission line 40 at the position apart from the output end part 19 by an electrical length EL4 of approximately 45°. The other end part of the second transmission line 30 is connected to the power supply terminal 39 and the first grounded shunt capacitor 32.

In this specification, the statement that the electrical length of a transmission line is approximately 90° means that the electrical length is 81° or more and 99° or less. The statement that the electrical length of a transmission line is approximately 45° means that the electrical length is 40.5° or more and 49.5° or less.

The output matching circuit 20 is designed so that, for instance, the load impedance for the second harmonic signal seen from the output end part 19 of the package is also 50Ω for all frequencies including the fundamental and the second harmonic. The bias circuit is provided between the output end part 19 and the external load 50. In this case, the load impedance for almost part of the second harmonic signal seen from the output end part 19 may fall below 50Ω due to the influence of the bias circuit.

First, the load impedance in the case of no output bias circuit is described for comparison purposes.

FIG. 3A is a circuit diagram of the semiconductor amplifier of the first embodiment in which no output bias circuit is connected. FIG. 3B is a Smith chart showing the load impedance seen from the reference plane Q2 (output end part of the package) in the semiconductor amplifier of the first embodiment. FIG. 3C is a Smith chart showing the load impedance seen from the reference plane Q3 (wire end). FIG. 3D is a Smith chart showing the load impedance seen from the reference plane Q4 (semiconductor element end).

As shown in FIG. 3A, in the first embodiment, for instance, a bonding wire 15, a transmission line 16, and a transmission line 21 are series connected in the output matching circuit 20. The transmission line 16 has a characteristic impedance $Z_{C1}$ of 3.5Ω and an electrical length EL1 of 90° or less (at $f_H$). The transmission line 21 has a characteristic impedance $Z_{C2}$ of 20Ω and an electrical length EL2 of 90° or less (at $f_C$). The characteristic impedance $Z_2$ of the transmission line 21 is normally made lower than 50Ω.

The characteristic impedance $Z_{C1}$ of the transmission line 16 is set between the characteristic impedance $Z_{C2}$ of the transmission line 21 and the resistance component of the output impedance of the semiconductor amplifying element 14. In this case, impedance transformation is performed by the transmission lines 21, 16 and the wire 15. Thus, the load impedance for the fundamental signal seen from the semiconductor element end can be made close to the output impedance desired for the semiconductor amplifying element 14.

As shown in FIG. 3B, when the load impedances for the fundamental and second harmonic signals seen from the reference plane Q2 (package end) are both 50Ω, the electrical length EL1 of the transmission line 16 is set to 90° or less (at $f_H$). Thus, as shown in FIG. 3C, the load impedance m5 for the second harmonic signal (at $2f_C$) as viewed from the reference plane Q3 (wire end) is made near-open impedance and inductive.

Furthermore, the inductance of the wire is added. Then, as shown in FIG. 3D, the output matching circuit 20 can be designed so that the load impedance for the second harmonic signal seen from the reference plane Q4 (semiconductor amplifying element end) is transformed to a further near-open impedance while matching the fundamental signal.

Next, the load impedance including the influence of the output bias circuit is described.

FIG. 2A is a Smith chart showing the load impedance seen from the reference plane Q0 in the feed branch section of the semiconductor amplifier device of the first embodiment. FIG. 2B is a Smith chart showing the load impedance seen from the reference plane Q1 (feed branch connection point). FIG. 2C is a Smith chart showing the load impedance seen from the reference plane Q2 (output end part of the package). FIG. 2D is a Smith chart showing the load impedance seen from the reference plane Q3 (wire end). FIG. 2E is a Smith chart showing the load impedance seen from the reference plane Q4 (semiconductor element end).

The impedance can be estimated by circuit simulation. The resistance $Z_L$ of the external load 50 is set to $Z_L=50\Omega$. The characteristic impedance $Z_{C4}$ of the first transmission line 40 is set to $Z_{C4}=50\Omega$. The characteristic impedance $Z_{C3}$ of the second transmission line 30 is set to $Z_{C3}=50\Omega$. The connection position 80 of one end part of the second transmission line 30 and the first transmission line 40 is located at an electrical length EL4a of approximately 45° from the output end part 19 of the output matching circuit 20 toward the external load 50. Here, the electrical length EL4b may be an arbitrary length.

The electrical length EL3 of the second transmission line 30 is set to approximately 90° at the fundamental signal ($f_C$). The capacitance C1 of the first grounded shunt capacitor 32 is set to 1000 pF or more. Then, the second transmission line 30 is tip-short at the center frequency $f_C$ (e.g., 3 GHz). The power supply terminal 39 is supplied with a DC voltage $V_D$ (drain voltage in the case of HEMT).

As shown in FIG. 2A, as viewed from the reference plane Q0 in the feed branch section of the semiconductor amplifier device of the first embodiment, the load impedance for the fundamental signal is near-open, and the load impedance for the second harmonic signal is near-short.

This feed branch is connected to the first transmission line 40. Then, as shown in FIG. 2B, as viewed from the reference plane Q1 (feed branch connection point) in the semiconductor amplifier device of the first embodiment, the load impedance for the fundamental signal is approximately 50Ω, and the load impedance for the second harmonic signal is near-short.

The electrical length EL4a of the first transmission line 40 is approximately 45°. Thus, as shown in FIG. 2C, as viewed from the reference plane Q2 (output end part 19 of the package) in the semiconductor amplifier device of the first embodiment, the load impedance for the fundamental signal is approximately 50Ω, and the load impedance for the second harmonic signal is near-open.

As viewed from the output end part of the package, the load impedance for the fundamental signal is approximately 50Ω, and the load impedance for the second harmonic signal is approximately 50Ω or more. Thus, as shown in FIG. 2D, the load impedance for the second harmonic signal seen from the reference plane Q3 (wire end) is made near-open impedance and inductive.

Furthermore, the inductance of the wire is added. Then, as shown in FIG. 2E, the load impedance for the second harmonic signal seen from the reference plane Q4 (semiconductor end) can be transformed to a further near-open impedance while matching the fundamental signal.

Thus, the load impedance for the second harmonic signal seen from the output end part 19 of the package is set to approximately 50Ω or more by configuring the output bias circuit 34 as described above. As a result, the load impedance for the second harmonic signal seen from the reference plane Q4 (semiconductor amplifying element end) is made near-open impedance. Thus, the efficiency is improved.

FIG. 4A is a configuration diagram of a semiconductor amplifier device according to a comparative example. FIG. 4B is a circuit diagram of a feed branch section of an external bias circuit.

The semiconductor amplifier device includes a packaged semiconductor amplifier 111 and a bias circuit 134. The packaged semiconductor amplifier 111 includes a semiconductor amplifying element 114, an input matching circuit 112, and an output matching circuit 120. The bias circuit 134 is connected between the output end part 119 of the package and an external load 150. The only difference from the first embodiment shown in FIGS. 1A and 1B is that there is no transmission line having an electrical length of approximately 45° between the connection point 180 connected with the feed branch and the output end part 119 of the package.

FIG. 5A is a Smith chart showing the load impedance seen from the reference plane Q0 in the feed branch section of the semiconductor amplifier device of the comparative example. FIG. 5B is a Smith chart showing the load impedance seen from the reference plane Q1 (feed branch connection point). FIG. 5C is a Smith chart showing the load impedance seen from the reference plane Q2. FIG. 5D is a Smith chart showing the load impedance seen from the reference plane Q3. FIG. 5E is a Smith chart showing the load impedance seen from the reference plane Q4 (semiconductor element end).

As shown in FIG. 5A, as viewed from the reference plane Q0 in the feed branch section of the semiconductor amplifier device of the comparative example, the load impedance for the fundamental signal is near-open, and the load impedance for the second harmonic signal is near-short.

This feed branch is connected. Then, as shown in FIG. 5B, as viewed from the reference plane Q1 (feed branch connection point) in the semiconductor amplifier device of the comparative example, the load impedance for the fundamental signal is approximately 50Ω, and the load impedance for the second harmonic signal is near-short.

There is no transmission line between the connection point 180 connected with the feed branch and the output end part 119 of the package. Thus, as shown in FIG. 5C, the load impedance seen from the reference plane Q2 (output end part of the package) in the semiconductor amplifier device of the comparative example is equal to the load impedance seen from the reference plane Q1 (feed branch connection point). The load impedance for the fundamental signal is approximately 50Ω, and the load impedance for the second harmonic signal is near-short.

As viewed from the output end part 119 of the package, the load impedance for the fundamental signal is 50Ω, but the load impedance for the second harmonic signal is near-short. Thus, as shown in FIG. 5D, the load impedance for the second harmonic signal seen from the reference plane Q3 (wire end) exhibits a large frequency dependence.

Furthermore, even if the inductance of the wire is added, as shown in FIG. 5E, the load impedance for the second harmonic signal seen from the reference plane Q4 (semiconductor amplifying element end) cannot be transformed to near-open impedance, although the fundamental signal is matched.

Thus, the load impedance for the second harmonic signal seen from the output end part 119 of the package is set to 50Ω or less by configuring the output bias circuit 134 as described above. As a result, the load impedance for the second harmonic signal seen from the reference plane Q4 (semiconductor amplifying element end) cannot be made near-open impedance. Thus, the efficiency is not improved.

In contrast, in the semiconductor amplifier device according to the first embodiment and the bias circuit 34 constituting the semiconductor amplifier device, the second harmonic signal impedance can be maintained at near-open impedance while maintaining the fundamental signal matching. This enables high efficiency operation.

Figure 6A:
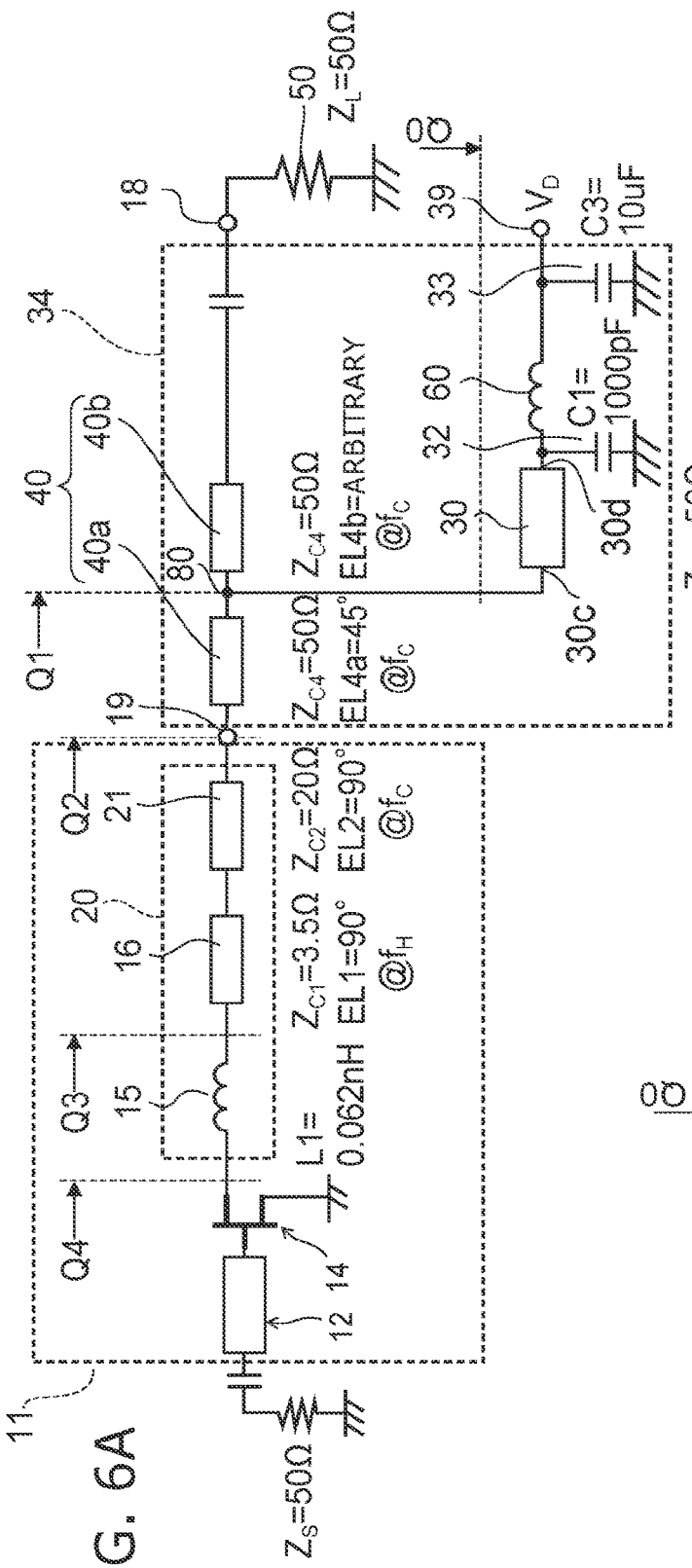
FIG. 6A is a circuit diagram of a semiconductor amplifier device according to a second embodiment.
Figure 6B:
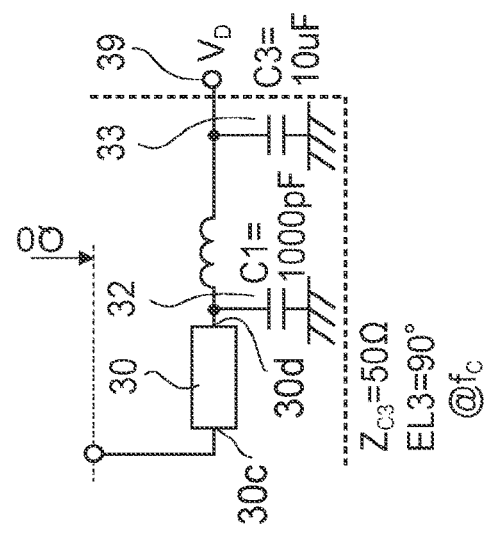
FIG. 6B is a circuit diagram of a feed branch section of an external bias circuit.

FIG. 6A is a circuit diagram of a semiconductor amplifier device according to a second embodiment. FIG. 6B is a circuit diagram of a feed branch section of an external bias circuit.

The bias circuit 34 can further include an inductor 60 and a grounded shunt capacitor 33 between the other end part of the second transmission line 30 grounded for radio frequency and the power supply terminal 39. The grounded shunt capacitor 33 serves as a good ground for signals in the band. The inductance L2 of the inductor 60 is set to e.g. 100 nH. Then, the impedance can be made higher for the second harmonic signal. Thus, the bias circuit 34 can be made less susceptible to the influence of the power supply terminal 39. Except for the bias circuit 34, the configuration is similar to that of the first embodiment.

FIG. 7A is a Smith chart showing the load impedance seen from the reference plane Q0 in the feed branch section of the semiconductor amplifier device of the second embodiment. FIG. 7B is a Smith chart showing the load impedance seen from the reference plane Q1 (feed branch connection point). FIG. 7C is a Smith chart showing the load impedance seen from the reference plane Q2 (output end part of the package). FIG. 7D is a Smith chart showing the load impedance seen from the reference plane Q3 (wire end). FIG. 7E is a Smith chart showing the load impedance seen from the reference plane Q4 (semiconductor amplifying element end).

As shown in FIG. 7C, the load impedance for the second harmonic signal seen from the reference plane Q2 (output end part 19 of the package) is successfully set to 50Ω or more. Thus, as shown in FIG. 7E, the load impedance for the second harmonic signal seen from the reference plane Q4 (semiconductor amplifying element end) is made near-open impedance while matching the fundamental signal. Thus, the efficiency is improved.

Figures 8A, 8B:
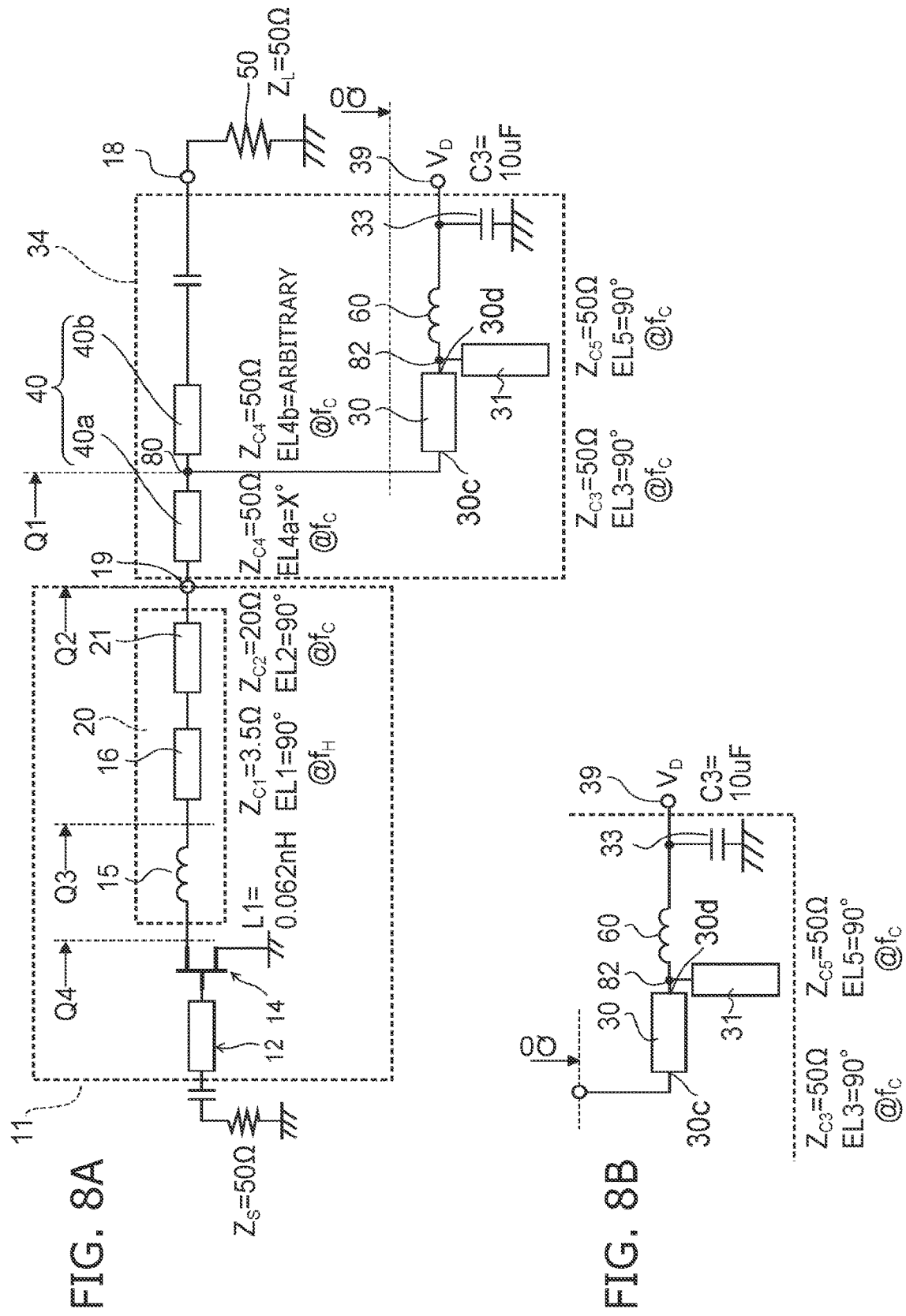
FIG. 8A is a circuit diagram of a semiconductor amplifier device according to a third embodiment.
FIG. 8B is a circuit diagram of a feed branch section of an external bias circuit.

FIG. 8A is a circuit diagram of a semiconductor amplifier device according to a third embodiment. FIG. 8B is a circuit diagram of a feed branch section of an external bias circuit.

The bias circuit 34 includes a first transmission line 40, a second transmission line 30, an open stub line 31, and a power supply terminal 39. The first transmission line 40 includes one end part connected to the output end part 19 of the output matching circuit 20, and the other end part connected to the external load 50. The characteristic impedance $Z_{C4}$ of the first transmission line 40 is set to 50Ω. The characteristic impedance $Z_{C3}$ of the second transmission line 30 can be set to 50Ω. The electrical length EL3 thereof is set to approximately 90° at the center frequency ($f_C$).

One end part of the second transmission line 30 is connected to the first transmission line 40. One end part of the second transmission line 30 is connected to the first transmission line 40 at a connection position 80 where the electrical length from the output end part 19 is X°. Here, 0°≤X≤180°. The characteristic impedance $Z_{C4}$ of the first transmission line 40 is made equal to the resistance $Z_L$ of the external load 50. Then, the electrical length between the connection position 80 and the output terminal 18 does not affect the impedance.

The open stub line 31 includes one end part connected to the other end part of the second transmission line 30 at a connection position 82, and the other end part having an electrical length EL5 of approximately 90° at the center frequency $f_C$ and being tip-open. The characteristic impedance $Z_{C5}$ of the open stub line 31 is set to e.g. 50Ω. The power supply terminal 39 is DC connected to the other end part of the second transmission line 30.

An inductor 60 can be further provided between the other end part of the second transmission line 30 and the power supply terminal 39. The configuration except for the bias circuit 34 is the same as that of the first embodiment.

The other end part of the second transmission line 30 is grounded not by a lumped-parameter ground capacitance, but by the open stub line 31 having an electrical length EL5 of approximately 90° at the center frequency $f_C$. Thus, at the connection position 82 of the open stub line 31, the impedance for the fundamental signal is near-short impedance. On the other hand, at the connection position 82 of the open stub line 31, the impedance for the second harmonic signal is made near-open impedance.

FIG. 9A is a Smith chart showing the load impedance seen from the reference plane Q0 in the feed branch section of the semiconductor amplifier device (X=0°) of the third embodiment. FIG. 9B is a Smith chart showing the load impedance seen from the reference plane Q1 (feed branch connection point). FIG. 9C is a Smith chart showing the load impedance seen from the reference plane Q2 (output end part of the package). FIG. 9D is a Smith chart showing the load impedance seen from the reference plane Q3. FIG. 9E is a Smith chart showing the load impedance seen from the reference plane Q4.

As shown in FIG. 9A, as viewed from the reference plane Q0 in the feed branch section of the semiconductor amplifier device of the third embodiment, the load impedance for the fundamental signal is near-open, and the load impedance for the second harmonic signal is also near-open.

This feed branch is connected. Then, as shown in FIG. 9B, as viewed from the reference plane Q1 (feed branch connection point) in the semiconductor amplifier device of the third embodiment, the load impedance for the fundamental signal is approximately 50Ω, and the load impedance for the second harmonic signal is also approximately 50Ω.

Also when the electrical length X of the first transmission line 40 is 0°, as shown in FIG. 9C, as viewed from the reference plane Q2 (output end part 19 of the package) in the semiconductor amplifier device of the third embodiment, the load impedance for the fundamental signal is approximately 50Ω, and the load impedance for the second harmonic signal is approximately 50Ω.

As viewed from the output end part 19 of the package, the load impedance for the fundamental signal is approximately 50Ω, and the load impedance for the second harmonic signal is approximately 50Ω. Thus, as shown in FIG. 9D, the load impedance for the second harmonic signal seen from the reference plane Q3 (wire end) is made near-open impedance and inductive.

Furthermore, the inductance of the wire is added. Then, as shown in FIG. 9E, the load impedance for the second harmonic signal seen from the reference plane Q4 (semiconductor amplifying element end) can be transformed to a further near-open impedance while matching the fundamental signal.

Thus, also when X=0°, the load impedance for the second harmonic signal seen from the output end part 19 of the package is set to approximately 50Ω or more by configuring the output bias circuit 34 using the open stub line 31 as described above. As a result, the load impedance for the second harmonic signal seen from the reference plane Q4 (semiconductor amplifying element end) is made near-open impedance. Thus, the efficiency is improved.

FIG. 10A is a Smith chart showing the load impedance seen from the reference plane Q0 in the feed branch section of the semiconductor amplifier device (X=45°) of the third embodiment. FIG. 10B is a Smith chart showing the load impedance seen from the reference plane Q1 (feed branch connection point). FIG. 10C is a Smith chart showing the load impedance seen from the reference plane Q2 (output end part of the package). FIG. 10D is a Smith chart showing the load impedance seen from the reference plane Q3 (wire end). FIG. 10E is a Smith chart showing the load impedance seen from the reference plane Q4 (semiconductor element end).

As shown in FIG. 10B, as viewed from the reference plane Q1 (feed branch connection point) in the semiconductor amplifier device of the third embodiment, the load impedance for the fundamental signal is approximately 50Ω, and the load impedance for the second harmonic signal is also approximately 50Ω. Thus, also in the case of X=45°, as shown in FIG. 10C, as viewed from the reference plane Q2 (output end part 19 of the package) in the semiconductor amplifier device of the third embodiment, the load impedance for the fundamental signal is approximately 50Ω, and the load impedance for the second harmonic signal is approximately 50Ω.

As viewed from the output end part 19 of the package, the load impedance for the fundamental signal is approximately 50Ω, and the load impedance for the second harmonic signal is approximately 50Ω. Thus, as shown in FIG. 10D, the load impedance for the second harmonic signal seen from the reference plane Q3 (wire end) is made near-open impedance and inductive.

Furthermore, the inductance of the wire is added. Then, as shown in FIG. 10E, the load impedance for the second harmonic signal seen from the reference plane Q4 (semiconductor amplifying element end) can be transformed to a further near-open impedance while matching the fundamental signal.

Thus, also when X=45°, the load impedance for the second harmonic signal seen from the output end part 19 of the package is set to approximately 5Ω or more by configuring the output bias circuit 34 using the open stub line 31 as described above. As a result, the load impedance for the second harmonic signal seen from the reference plane Q4 (semiconductor amplifying element end) is made near-open impedance. Thus, the efficiency is improved. In the bias circuit 34 of the third embodiment, the electrical length EL4a of the first transmission line 40 can be set arbitrarily. This increases the degree of freedom of the layout of the bias circuit 34.

Figures 11A, 11B:
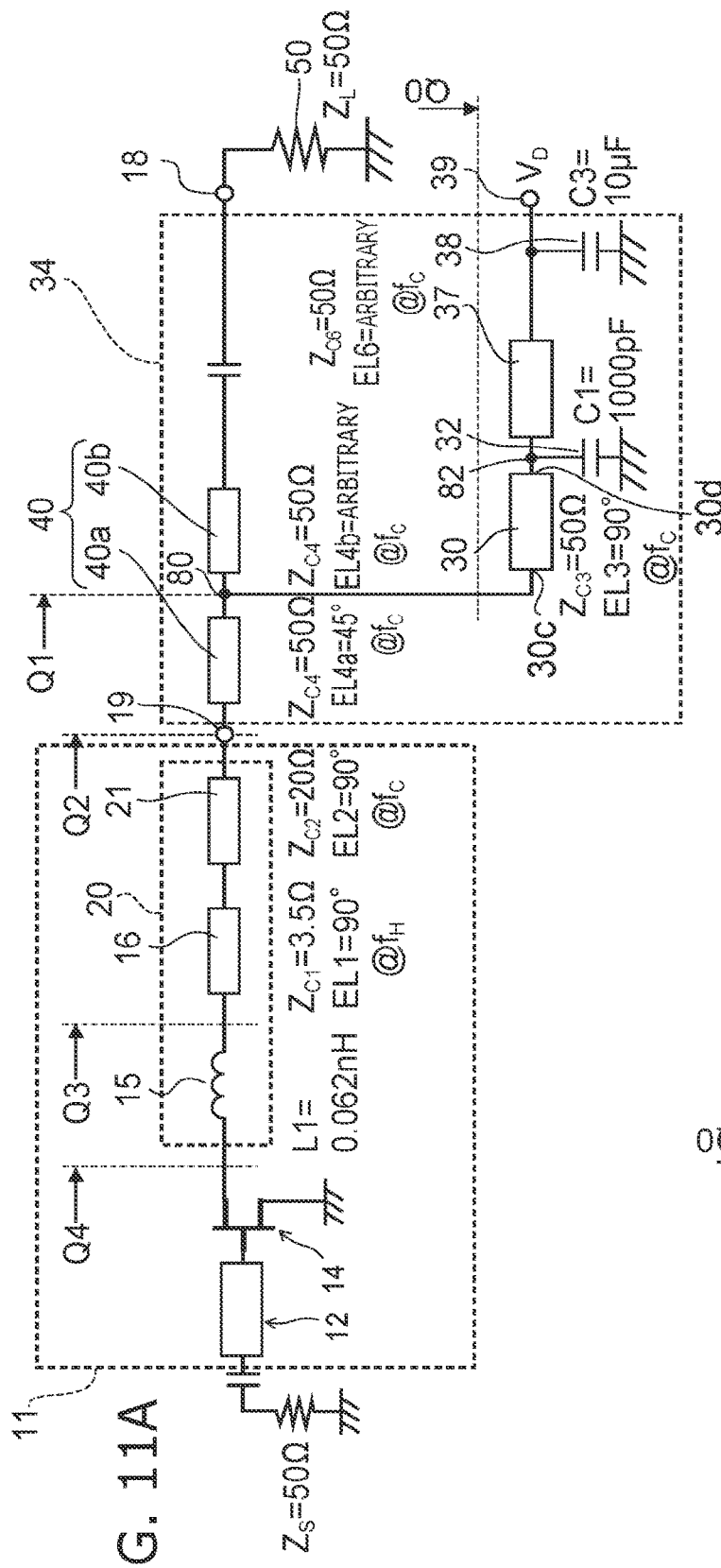
FIG. 11A is a circuit diagram of a semiconductor amplifier device according to a fourth embodiment.
FIG. 11B is a circuit diagram of a feed branch section of an external bias circuit.

FIG. 11A is a circuit diagram of a semiconductor amplifier device according to a fourth embodiment. FIG. 11B is a circuit diagram of a feed branch section of an external bias circuit.

In addition to the bias circuit of the first embodiment, the bias circuit 34 further includes a third transmission line 37 and a grounded shunt capacitor 38. The third transmission line is provided between the other end part of the second transmission line 30 and the power supply terminal 39. The grounded shunt capacitor 38 is provided between the power supply terminal 39 and the ground. The characteristic impedance $Z_{C6}$ of the third transmission line 37 is set to 50Ω. The electrical length EL6 of the third transmission line 37 is made arbitrary. The capacitance C3 of the grounded shunt capacitor 38 is set to e.g. 10 μF. Except for the bias circuit 34, the configuration is the same as that of the first embodiment.

FIG. 12A is a Smith chart showing the load impedance seen from the reference plane Q0 in the feed branch section of the semiconductor amplifier device of the fourth embodiment. FIG. 12B is a Smith chart showing the load impedance seen from the reference plane Q1 (feed branch connection point). FIG. 12C is a Smith chart showing the load impedance seen from the reference plane Q2 (output end part of the package). FIG. 12D is a Smith chart showing the load impedance seen from the reference plane Q3 (wire end). FIG. 12E is a Smith chart showing the load impedance seen from the reference plane Q4 (semiconductor amplifying element end).

The electrical length EL6 of the third transmission line 37 is arbitrary. However, its connection point 82 is grounded by the lumped-parameter ground capacitance 38. Thus, as shown in FIG. 12A, as viewed from the reference plane Q0 in the feed branch section of the semiconductor amplifier device of the fourth embodiment, the load impedance for the fundamental signal is near-open, and the load impedance for the second harmonic signal is near-short.

This feed branch is connected. Then, as shown in FIG. 12B, as viewed from the reference plane Q1 (feed branch connection point) in the semiconductor amplifier device of the fourth embodiment, the load impedance for the fundamental signal is approximately 50Ω, and the load impedance for the second harmonic signal is near-short.

The electrical length EL4a of the first transmission line 40 is approximately 45°. Thus, as shown in FIG. 12C, as viewed from the reference plane Q2 (output end part 19 of the package) in the semiconductor amplifier device of the fourth embodiment, the load impedance for the fundamental signal is approximately 50Ω, and the load impedance for the second harmonic signal is near-open.

As viewed from the output end part 19 of the package, the load impedance for the fundamental signal is 50Ω, and the load impedance for the second harmonic signal is 50Ω or more. Thus, as shown in FIG. 12D, the load impedance for the second harmonic signal seen from the reference plane Q3 (wire end) is made near-open impedance and inductive.

Furthermore, the inductance of the wire is added. Then, as shown in FIG. 12E, the load impedance for the second harmonic signal seen from the reference plane Q4 (semiconductor amplifying element end) can be transformed to a further near-open impedance while matching the fundamental signal.

Thus, the load impedance for the second harmonic signal seen from the output end part 19 of the package is set to 50Ω or more by configuring the output bias circuit 34 as described above. As a result, the load impedance for the second harmonic signal seen from the reference plane Q4 (semiconductor amplifying element end) is made near-open impedance. Thus, the efficiency is improved.

Figures 13A, 13B:
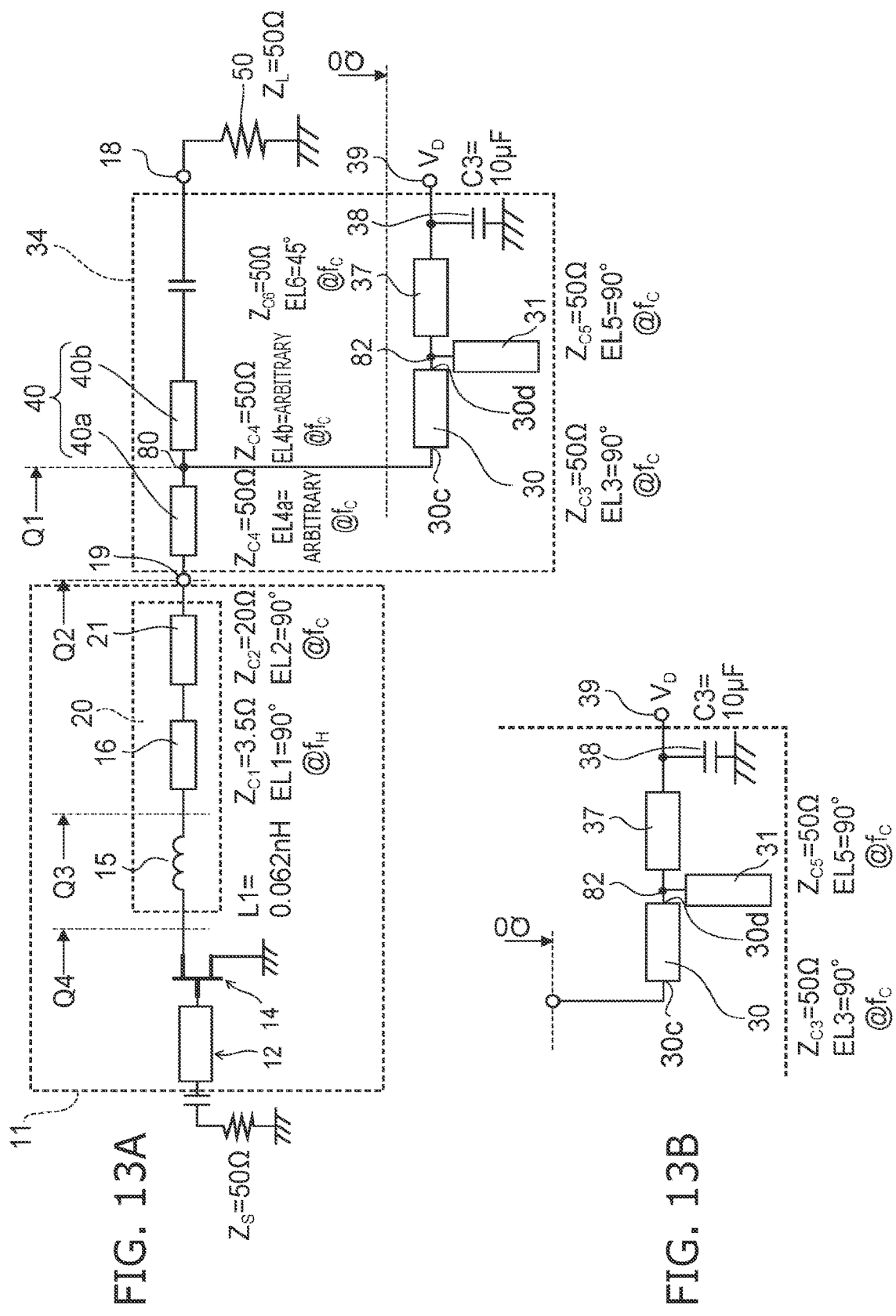
FIG. 13A is a circuit diagram of a semiconductor amplifier device according to a fifth embodiment.
FIG. 13B is a circuit diagram of a feed branch section of an external bias circuit.

FIG. 13A is a circuit diagram of a semiconductor amplifier device according to a fifth embodiment. FIG. 13B is a circuit diagram of a feed branch section of an external bias circuit.

The bias circuit 34 includes an open stub line 31 instead of the grounded shunt capacitor 32 of the bias circuit of the fourth embodiment. The characteristic impedance $Z_{C6}$ of the third transmission line 37 is set to 50Ω. The electrical length EL6 of the third transmission line 37 is set to approximately 45°. The capacitance C3 of the grounded shunt capacitor 38 is set to e.g. 10 μF. The electrical length EL4a of the first transmission line 40 can be set arbitrarily. Except for the bias circuit 34, the configuration is the same as that of the first embodiment.

FIG. 14A is a Smith chart showing the load impedance seen from the reference plane Q0 in the feed branch section of the semiconductor amplifier device of the fifth embodiment. FIG. 14B is a Smith chart showing the load impedance seen from the reference plane Q1 (feed branch connection point). FIG. 14C is a Smith chart showing the load impedance seen from the reference plane Q2 (output end part of the package). FIG. 14D is a Smith chart showing the load impedance seen from the reference plane Q3 (wire end). FIG. 14E is a Smith chart showing the load impedance seen from the reference plane Q4 (semiconductor amplifying element end).

The electrical length EL6 of the third transmission line 37 is set to approximately 45°. Thus, even if its tip is grounded by the lumped-parameter ground capacitance 38, the impedance for the second harmonic signal at the connection point 82 is near-open. Furthermore, the open stub line 31 is used instead of the grounded shunt capacitor 32. Thus, as shown in FIG. 14A, as viewed from the reference plane Q0 in the feed branch section of the semiconductor amplifier device of the fifth embodiment, the load impedance for the fundamental signal is near-open, and the load impedance for the second harmonic signal is also near-open.

This feed branch is connected. Then, as shown in FIG. 14B, as viewed from the reference plane Q1 (feed branch connection point), the load impedance for the fundamental signal is approximately 50Ω, and the load impedance for the second harmonic signal is also approximately 50Ω.

Also when the electrical length EL4a of the first transmission line 40 is 0°, as shown in FIG. 14C, as viewed from the reference plane Q2 (output end part 19 of the package) in the semiconductor amplifier device of the fifth embodiment, the load impedance for the fundamental signal is approximately 50Ω, and the load impedance for the second harmonic signal is also approximately 50Ω.

As viewed from the output end part 19 of the package, the load impedance for the fundamental signal is approximately 50Ω, and the load impedance for the second harmonic signal is also approximately 50Ω. Thus, as shown in FIG. 14D, the load impedance for the second harmonic signals seen from the reference plane Q3 (wire end) is made near-open impedance and inductive.

Furthermore, the inductance of the wire is added. Then, as shown in FIG. 14E, the load impedance for the second harmonic signal seen from the reference plane Q4 (semiconductor amplifying element end) can be transformed to a further near-open impedance while matching the fundamental signal.

Thus, the load impedance for the second harmonic signal seen from the output end part 19 of the package is set to approximately 50Ω by configuring the output bias circuit 34 as described above. As a result, the load impedance for the second harmonic signal seen from the reference plane Q4 (semiconductor amplifying element end) is made near-open impedance. Thus, the efficiency is improved.

In the bias circuit 34 of the fifth embodiment, the electrical length EL4a of the first transmission line 40 can be set arbitrarily. This increases the degree of freedom of the layout of the bias circuit 34.

In the semiconductor amplifier device according to the first to fifth embodiments and the bias circuit used therein, as viewed from the output end part of the package, the load impedance for the fundamental signal is 50Ω, and the load impedance for the second harmonic signal is approximately 50Ω or more. Thus, the second harmonic signal impedance can be set to near-open impedance while maintaining the fundamental signal matching. This facilitates high efficiency operation of the semiconductor amplifier device. Such a semiconductor amplifier device can be widely used in radar devices and microwave communication device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor amplifier bias circuit provided between an output matching circuit of a semiconductor amplifying element and an external load comprising:
   a first transmission line connected to an output end part of the output matching circuit and the external load;
   a first grounded shunt capacitor;
   a second transmission line including one end part connected to the first transmission line and the other end part connected to the first grounded shunt capacitor, electrical length of the second transmission line being approximately 90° at a center frequency of a band, the one end part being connected to the first transmission line at a position apart from the output end part by an electrical length of approximately 45° at the center frequency; and
   a power supply terminal connected to a connection point of the first grounded shunt capacitor and the other end part of the second transmission line,
   wherein a load impedance for a fundamental signal, as viewed from a connection point between the first transmission line and the output matching circuit, is approximately equal to a resistance of the external load, and
   a load impedance for second harmonic signal, as viewed from the connection point, is approximately open.

2. The circuit according to claim 1, further comprising:
   an inductor provided between the other end part of the second transmission line and the power supply terminal; and
   a second grounded shunt capacitor provided at a connection point of the inductor and the power supply terminal.

3. The circuit according to claim 1, further comprising:
   a third transmission line provided between the other end part of the second transmission line and the power supply terminal; and
   a second grounded shunt capacitor provided at a connection point of the third transmission line and the power supply terminal.

4. The circuit according to claim 1, wherein a characteristic impedance of the first transmission line is made equal to the resistance of the external load.

5. A semiconductor amplifier bias circuit provided between an output matching circuit of a semiconductor amplifying element and an external load comprising:
- a first transmission line connected to an output end part of the output matching circuit and the external load;
- a second transmission line including one end part connected to the first transmission line, electrical length of the second transmission line being approximately 90° at a center frequency of a band;
- an open stub line including one end part connected to the other end part of the second transmission line and the other end part made open, an electrical length of the open stub line being approximately 90° at the center frequency; and
- a power supply terminal connected to the other end part of the second transmission line.

6. The circuit according to claim 5, wherein a characteristic impedance of the first transmission line is made equal to a resistance of the external load.

7. A semiconductor amplifier bias circuit provided between an output matching circuit of a semiconductor amplifying element and an external load comprising:
- a first transmission line connected to an output end part of the output matching circuit and the external load;
- a second transmission line including one end part connected to the first transmission line, electrical length of the second transmission line being approximately 90° at a center frequency of a band;
- an open stub line including one end part connected to the other end part of the second transmission line and the other end part made open, an electrical length of the open stub line at the center frequency being approximately 90° at the center frequency;
- a third transmission line including one end part connected to a connection point of the other end part of the second transmission line and the one end part of the open stub line, electrical length of the third transmission line being approximately 45° at the center frequency;
- a second grounded shunt capacitor connected to another end part of the third transmission line; and
- a power supply terminal connected to a connection point of the other end part of the third transmission line and the grounded shunt capacitor.

8. The circuit according to claim 7, wherein a characteristic impedance of the first transmission line is made equal to a resistance of the external load.

9. A semiconductor amplifier device comprising:
- the semiconductor amplifier bias circuit according to claim 1;
- a semiconductor amplifying element; and
- an output matching circuit including a bonding wire connected to the semiconductor amplifying element and a transmission line connected to the bonding wire, an electrical length of the transmission line at an upper limit frequency of the band being 90° or less at an upper limit frequency of the band,
wherein a load impedance seen from an output electrode of the semiconductor amplifying element is approximately open for the second harmonic signal.

10. The device according to claim 9, wherein the semiconductor amplifying element is one of HEMT and MESFET.

11. A semiconductor amplifier device comprising:
- the semiconductor amplifier bias circuit according to claim 5;
- a semiconductor amplifying element; and
- an output matching circuit including a bonding wire connected to the semiconductor amplifying element and a transmission line connected to the bonding wire, an electrical length of the transmission line at an upper limit frequency of the band being 90° or less at an upper limit frequency of the band.

12. The device according to claim 11, wherein the semiconductor amplifying element is one of HEMT and MESFET.

13. A semiconductor amplifier device comprising:
- the semiconductor amplifier bias circuit according to claim 7;
- a semiconductor amplifying element; and
- an output matching circuit including a bonding wire connected to the semiconductor amplifying element and a transmission line connected to the bonding wire, an electrical length of the transmission line at an upper limit frequency of the band being 90° or less at an upper limit frequency of the band.

14. The device according to claim 13, wherein the semiconductor amplifying element is one of HEMT and MESFET.

* * * * *